(12) United States Patent
Bucci

(10) Patent No.: US 10,745,796 B2
(45) Date of Patent: Aug. 18, 2020

(54) MULTI-MASK ALIGNMENT SYSTEM AND METHOD

(71) Applicant: Advantech Global, LTD, Tortola (VG)

(72) Inventor: Brian Arthur Bucci, Pittsburgh, PA (US)

(73) Assignee: Advantech Global, LTD, Tortola (VG)

( * ) Notice: Subject to any disclaimer, the term of this patent is extended or adjusted under 35 U.S.C. 154(b) by 0 days.

(21) Appl. No.: 16/371,588

(22) Filed: Apr. 1, 2019

(65) Prior Publication Data

US 2019/0226076 A1 Jul. 25, 2019

Related U.S. Application Data

(63) Continuation-in-part of application No. 15/518,506, filed as application No. PCT/US2015/055517 on Oct. 14, 2015, now Pat. No. 10,323,316.

(60) Provisional application No. 62/065,291, filed on Oct. 17, 2014.

(51) Int. Cl.
*C23C 14/04* (2006.01)
*C23C 14/54* (2006.01)
*H01L 21/68* (2006.01)

(52) U.S. Cl.
CPC ............ *C23C 14/042* (2013.01); *C23C 14/54* (2013.01); *H01L 21/682* (2013.01)

(58) Field of Classification Search
CPC .................................................. C23C 14/042
See application file for complete search history.

(56) References Cited

U.S. PATENT DOCUMENTS

| | | | | |
|---|---|---|---|---|
| 2002/0062785 A1* | 5/2002 | Kim | ...................... | C23C 14/042 118/504 |
| 2004/0123804 A1* | 7/2004 | Yamazaki | ............. | C23C 14/246 118/723 VE |
| 2014/0370196 A1* | 12/2014 | Kim | ...................... | C23C 14/042 427/282 |

\* cited by examiner

*Primary Examiner* — Joseph A Miller, Jr.
(74) *Attorney, Agent, or Firm* — The Webb Law Firm

(57) ABSTRACT

In a multi-mask alignment system and method, a carrier frame is provided having a number of apertures therethrough. A number of shadow mask-frame combinations are also provided. Each shadow mask-frame combination includes a first set of alignment features and each shadow mask-frame combination is positioned on a first side of the carrier with the frame supporting the shadow mask in alignment with one of the apertures. A single alignment stage is provided and a control system including a programmed controller is also provided. Under the control of the controller, the single alignment stage translates to each shadow mask-frame combination, one-at-a time, and adjusts the position of the shadow mask-frame combination based on positions of the first set of alignment features determined by the controller.

6 Claims, 18 Drawing Sheets

MULTI-MASK ALIGNMENT SYSTEM AND METHOD

CROSS REFERENCE TO RELATED APPLICATIONS

This application is a continuation-in-part of U.S. Ser. No. 15/518,506, which is the national phase of PCT/US2015/055517, filed Oct. 14, 2015, which claims the benefit of U.S. Provisional Application No. 62/065,291, filed Oct. 17, 2014, all of which are incorporated herein by reference.

BACKGROUND OF THE INVENTION

Field of the Invention

The present invention relates to a system and method for forming an effectively larger area shadow mask out of a number of smaller area shadow masks.

Description of Related Art

In the field of shadow mask vapor deposition, there is a trend to utilize increasingly larger area shadow masks that include one or more openings corresponding to a desired pattern of material to be deposited on a substrate from a deposition source. A problem, however, with forming increasingly larger area sized shadow masks is in avoiding run-on errors in positioning of openings across the dimensions of the shadow mask. Stated differently, a problem with forming increasingly larger area sized shadow masks is that it becomes increasingly more difficult to maintain accurate dimensional stability between openings used for depositing patterns of material on a substrate across the dimensions of the shadow mask.

SUMMARY OF THE INVENTION

Various preferred and non-limiting examples or aspects of the present invention will now be described and set forth in the following numbered clauses.

Clause 1: A multi-shadow mask alignment system comprises: a carrier including a plurality of apertures therethrough, each aperture having associated therewith a combination frame and shadow mask positioned on a first side of the carrier with the frame supporting the shadow mask in alignment with the aperture; an alignment system positioned on a second side of the carrier opposite the first side, the alignment system operative for adjusting a position of each combination frame and shadow mask, one-at-a-time, and for translating between pairs of combination frames and shadow masks between adjusting the positions of said pairs of combination frames and shadow masks; and a control system including a programmed controller coupled to the alignment system, the controller operative for controlling the alignment system to translate between pairs of combination frames and shadow masks and to align each combination frame and shadow mask based on a position determined by the control system of a first set of alignment features of the combination frame and shadow mask.

Clause 2: The alignment system of clause 1, wherein the control system includes a digital camera coupled to the controller, the camera positioned on the alignment system, the camera operative for acquiring and forwarding digital images including each first set of alignment features to the controller which is operative for processing the digital images and, based on the processed digital images, for causing the alignment system to align the position of the corresponding combination frame and shadow mask such that the first set of alignment features are aligned to a predetermined set of coordinates stored in a memory of the controller.

Clause 3: The alignment system of clause 1 or 2, wherein: the alignment system is operative for translating to each combination frame and shadow mask, one-at-a-time; at each combination frame and shadow mask, the alignment system is operative for adjusting a position of said combination frame and shadow mask; and for each combination frame and shadow mask, the controller is operative for causing the alignment system to align said combination frame and shadow mask.

Clause 4: The alignment system of any one of clauses 1-3, wherein: the alignment system is operative for adjusting the position of each combination frame and shadow mask in two or more of X, Y and θ directions; the X and Y directions are parallel to the first side of the carrier; and the θ direction is rotational around a Z direction which is normal to the first side of the carrier.

Clause 5: The alignment system of any one of clauses 1-4, wherein the first set of alignment features are included on the shadow mask.

Clause 6: The alignment system of any one of clauses 1-5, wherein each alignment feature is one of the following: a visual mark or a hole.

Clause 7: The alignment system of any one of clauses 1-6, wherein the positions of the combination frames and shadow masks are adjusted with respect to each other.

Clause 8: A multi-mask alignment method, comprising: (a) providing a carrier having a plurality of apertures therethrough; (b) providing plural shadow mask-frame combinations on a first side of the carrier, wherein each shadow mask-frame combination includes a first set of alignment features, each shadow mask-frame combination positioned on the first side of the carrier with the frame supporting the shadow mask in alignment with one of the apertures; (c) providing an alignment system at a first position on a second side of the carrier opposite the first side; (d) providing a control system including a programmed controller; (e) under the control of the controller, causing the alignment system at the first position to adjust the X, Y and/or θ position of one of the plural shadow mask-frame combinations from the second side of the carrier based on positions of the first set of alignment features of said one of the plural shadow mask-frame combinations determined by the controller; (f) following step (e), under the control of the controller, causing the alignment system to translate to another position on the second side of the carrier; and (g) following step (f), under the control of the controller, causing the alignment system to adjust the X, Y and/or θ position of another one of the plural shadow mask-frame combinations from the second side of the carrier based on positions of the first set of alignment features of said other one of the plural shadow mask-frame combinations determined by the controller.

Clause 9: The method of clause 8, further including repeating steps (f) and (h).

Clause 10: The method of clause 8 or 9, further including: (h) securing each shadow mask-frame combination to the carrier.

Clause 11. The method of any one of clauses 8-10, further including: (i) following step (g), performing vapor deposition through each shadow mask.

Clause 12. The method of any one of clauses 8-11, wherein the control system includes a digital camera positioned on the alignment system and steps (e) and (g) include causing the alignment system to adjust the position of the one and the other shadow mask-frame combinations based on images of the first and second shadow mask-frame combinations acquired from the camera by the controller such that the first set of alignment features of each of the one and the other shadow mask-frame combinations are aligned to one or more sets of coordinates stored in a memory of the controller.

Clause 13: The alignment method of any one of clauses 8-12, wherein the positions of the one and the other combination frames and shadow masks are adjusted with respect to each other.

DESCRIPTION OF THE INVENTION

Figure 1:
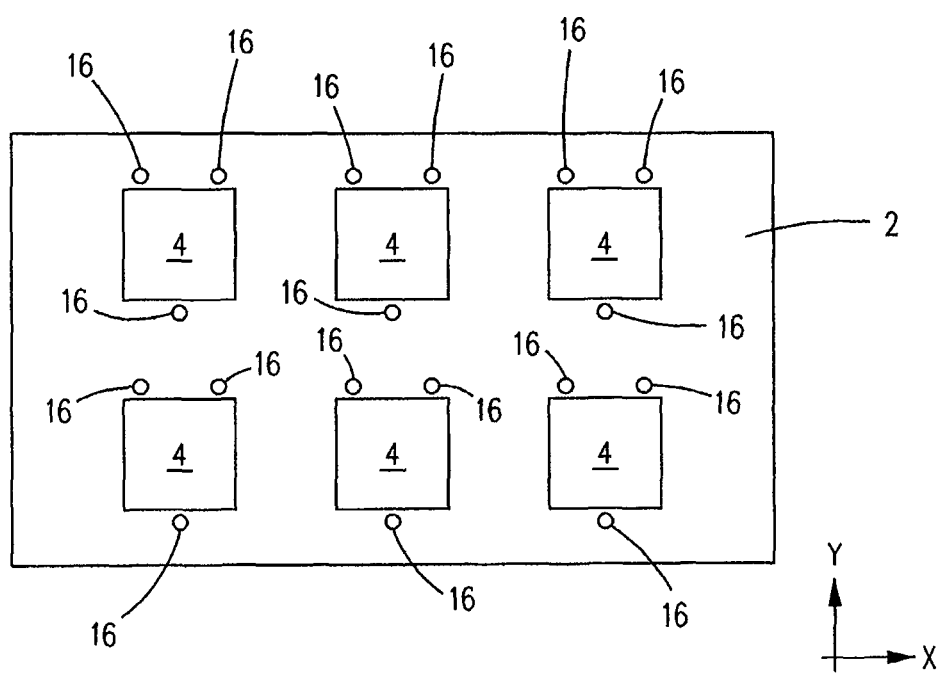
FIG. 1 is a schematic plan view of a carrier frame of a multi-shadow mask alignment system.

Various non-limiting examples will now be described with reference to the accompanying figures where like reference numbers correspond to like or functionally equivalent elements.

The various example multi-mask alignment systems described herein enable construction of an effectively larger area shadow mask out of a number of smaller area shadow masks. By constructing the effectively larger area shadow mask out of smaller area shadow masks, it is possible to maintain greater geometrical precision of the holes and apertures in the smaller shadow masks over a larger area, e.g., over an area larger than each smaller shadow mask alone. Since each small shadow mask is independent of the other small shadow masks, it is also possible to properly size the holes and apertures of each small shadow mask without affecting the dimensions of the other small shadow mask.

The various example multi-mask alignment systems described herein provide for aligning a number of small area shadow masks (one, or two, or more at a time; or all simultaneously) to form an effectively larger area shadow mask. There is no specific limit to the number of small shadow masks that can be used to form the effectively larger shadow mask.

The basic method of operation of each example multi-mask alignment system is to perform fine or precision alignment of each small shadow mask independent of each other small shadow mask. The alignment of each small shadow mask can be done with reference to alignment features associated with an alignment substrate, such as a glass plate, and alignment features associated with the small shadow masks; or by comparing alignment features associated with the small shadow masks with predetermined coordinates stored in a memory of a controller using a coordinate measuring machine (CMM) approach.

If utilizing the CMM approach, the alignment features on the small shadow masks, positioned in coarse (or general) alignment on a carrier frame, are compared to the predetermined coordinates stored in a memory of the controller. The coordinates can be stored in, for example, a drawing file, such as a CAD file, or in any suitable and/or desirable file type that facilitates the controller acquiring digital images of the small shadow masks via one or more digital (CCD) cameras and comparing the alignment features in the acquired digital images of the small shadow masks to the predetermined coordinates stored in the memory of the controller. In an example, each predetermined coordinate can include a digital representation of the corresponding alignment feature acquired from an image, whereupon the controller aligns the alignment feature in an acquired image with the digital representation of the alignment feature. However, this is not to be construed in a limiting sense.

If using the alignment substrate approach, the alignment substrate is located in spaced relation above the small shadow masks, which are positioned in coarse (or general) alignment on the carrier frame, with a gap between the bottom of the alignment substrate and the top of the small shadow masks. One or more digital (CCD) cameras are positioned above the alignment substrate to acquire images of the alignment features on the shadow masks and the alignment features of the alignment substrate. In an example, the alignment features on the shadow masks and the alignment features of the alignment substrate can be complementary. For example, the alignment features of the alignment substrate can include a pattern of solid disk or circles while the alignment features of the small shadow mask can include a pattern of open holes or rings, each of which is larger than the corresponding disk or circle on the alignment substrate. Thus, alignment could be quantified by measuring the position of each disk or circle within a hole or ring.

If using the CCM approach, each small shadow mask includes alignment features. However, instead of comparing these alignment features to marks on the alignment substrate, the absolute coordinates of the alignment features on the small shadow masks can be compared to the predetermined coordinates for the alignment features stored in the file in the memory of the controller. In this way, the alignment features on each small shadow mask can be used to compute the alignment of the small shadow masks relative to each other.

During alignment using the alignment substrate approach or the CCM approach, a mask frame supporting each small shadow mask is lifted by pins of an alignment stage that is part of an alignment system positioned, in an example, below the carrier frame. The carrier frame includes holes, or apertures, or openings to allow the pins to pass through the carrier frame and perform this operation. Each small mask frame is lifted (in the Z direction) off the surface of the carrier frame high enough to allow motion in the X, Y and/or θ directions, but not high enough to contact the bottom of the alignment substrate, if present. When using the alignment substrate approach, alignment between alignment features of each small shadow mask and corresponding alignment features of the alignment substrate is performed. In the case of the CCM approach, contact with the alignment substrate is not of concern because it is not present. However, it is still desirable to only lift the mask frames a small distance to avoid measurement error.

Each small shadow mask and mask frame combination can be aligned independently of each other small shadow mask and frame combination. This may be accomplished by an alignment system that includes an alignment stage that aligns a number of small shadow masks and frames or by an alignment system that includes one alignment stage per small shadow mask and frame. The number of alignment stages utilized to align the small shadow masks is not to be construed in a limiting sense.

After fine or precision alignment of each small shadow mask and frame comprising the large shadow mask is complete, the small shadow masks and frames are lowered back to the carrier frame. If present, the alignment substrate can be removed. Finally, the fine or precision aligned mask frames can be bonded to the carrier frame by any suitable or desirable means, such as, without limitation, adhesive or welding.

A first example multi-mask alignment system will now be described with reference to FIGS. 1-5.

The first example multi-mask alignment system includes a carrier (or carrier frame) 2 (FIG. 1) having a plurality of apertures 4 therethrough. Associated with each aperture 4 is a frame 6 supporting a shadow mask 8 (FIGS. 2 and 3) which includes one or more apertures (not shown) therethrough in a pattern corresponding to a desired pattern of material(s) desired to be vapor deposited through said apertures in said shadow mask 8.

Figure 2:
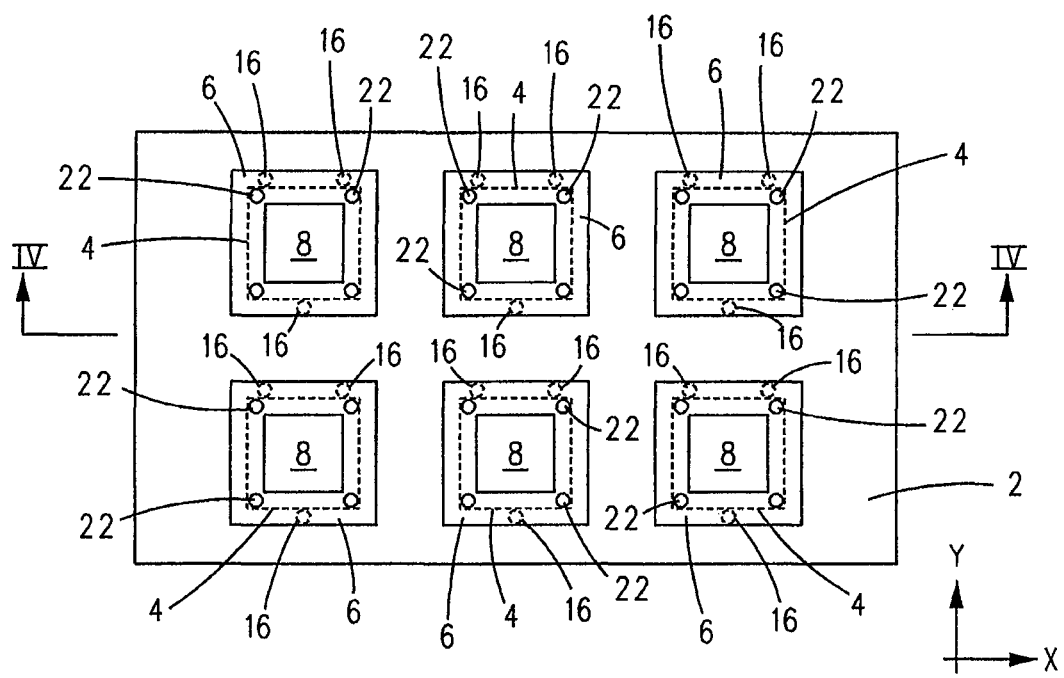
FIG. 2 is a schematic plan view of plural combination frames and shadow masks positioned on the carrier frame of FIG. 1, with each shadow mask positioned in alignment with an aperture in the carrier frame.
Figure 3:
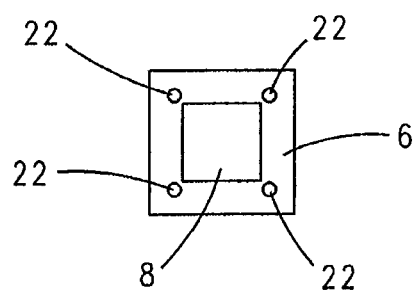
FIG. 3 is an isolated schematic plan view of a combination frame and shadow mask including a first set of alignment features on the frame.

In an example, carrier 2 supports six combination frames and shadow mask 6/8 on a first (top) side of carrier 2 with each frame 6 supporting its corresponding shadow mask 8 in alignment with an aperture 4 of carrier 2 (FIG. 2). In an example, each shadow mask 8 can have the same pattern of apertures, or a different pattern of apertures. In another example, two or more (but less than all) of shadow masks 8 can have the same pattern of apertures while the remaining shadow mask(s) can have a different pattern of apertures. Each shadow mask 8 having the same or different pattern of apertures than the other shadow masks 8 is not to be construed in a limiting sense.

Initially, each combination frame and shadow mask 6/8 is positioned on carrier 2 in coarse, rough, or general alignment with the corresponding aperture 4 of carrier 2.

Figure 4:
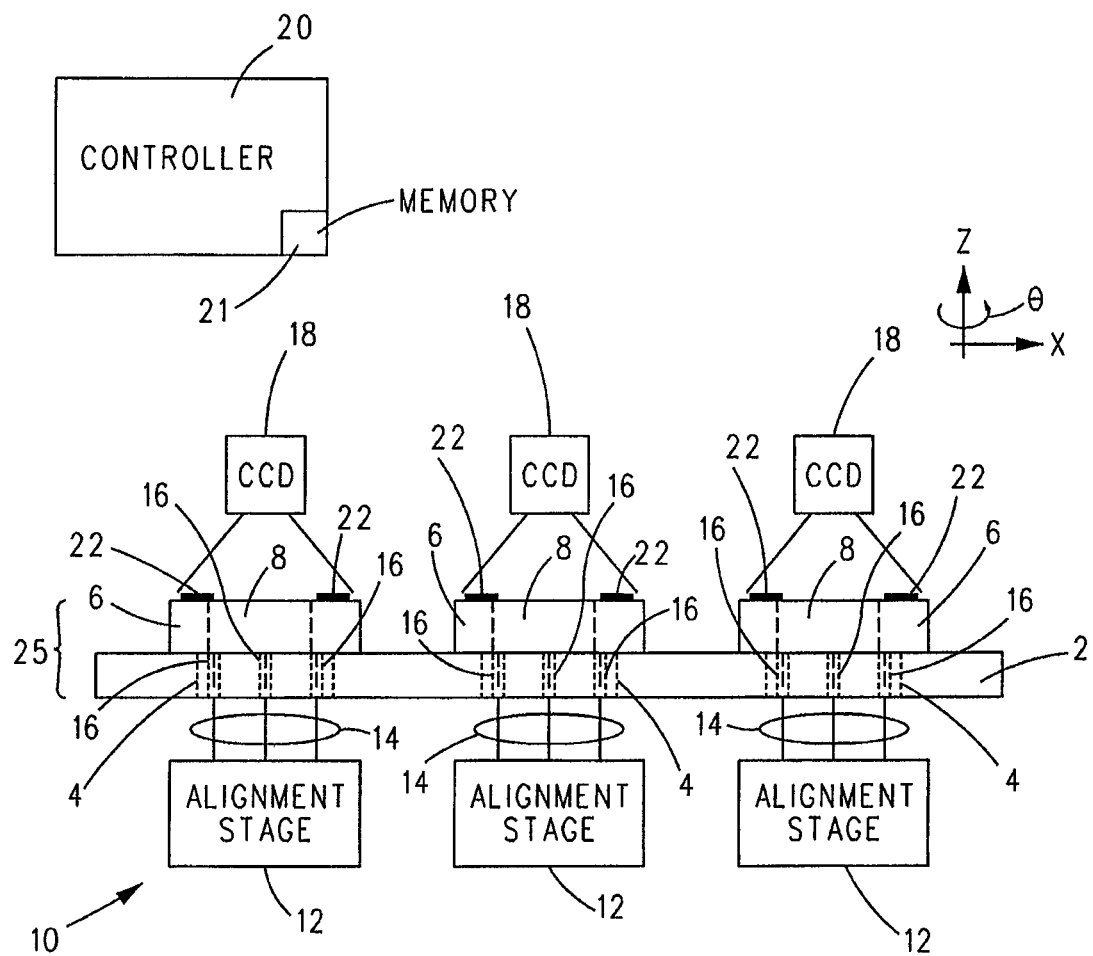
FIG. 4 is a schematic side view taken along lines IV-IV in FIG. 2 of the carrier frame including three combination frames and shadow masks in contact with the carrier frame, and further including a schematic of an alignment system including one or more alignment stages positioned below the carrier frame and three digital (CCD) cameras positioned above the three combination frames and shadow masks.
Figure 5:
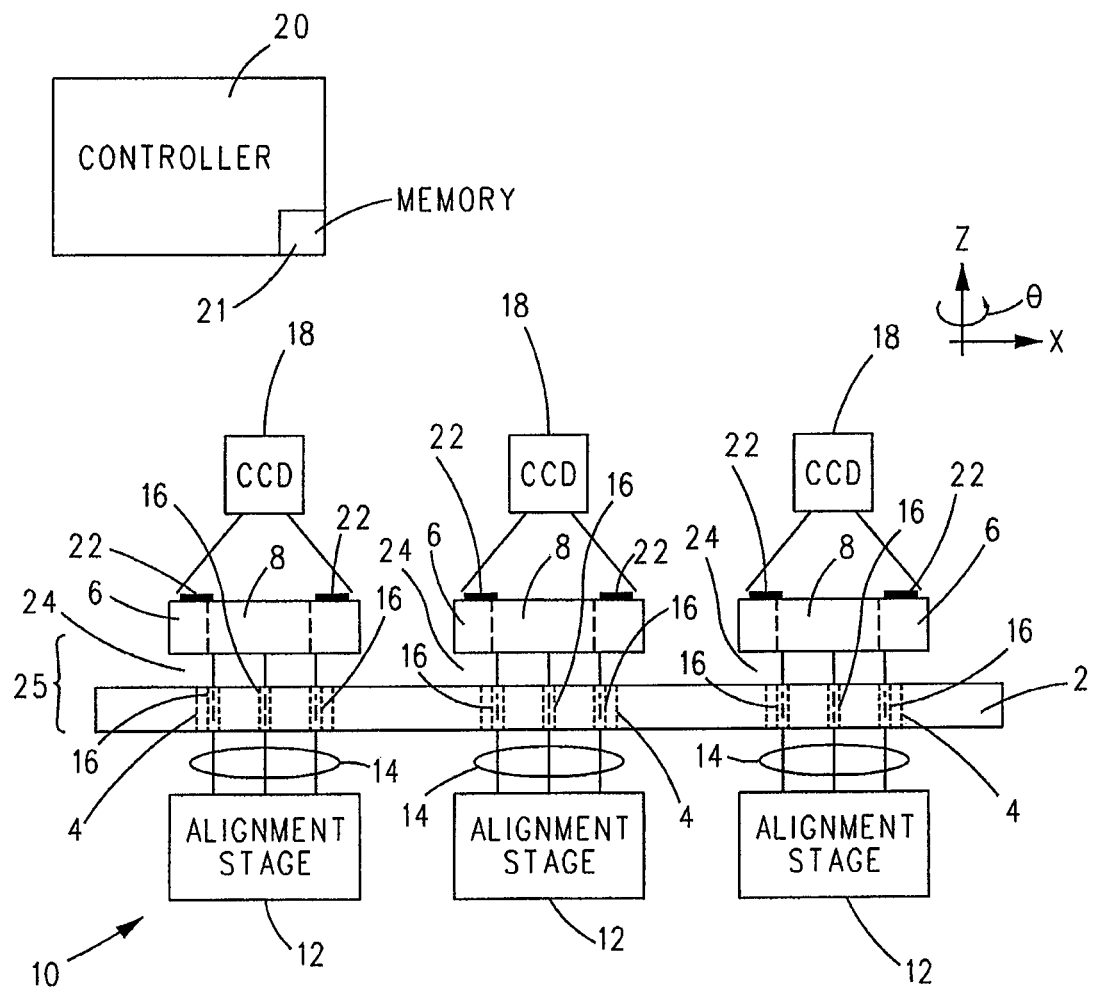
FIG. 5 is a view of the multi-mask alignment system shown in FIG. 4 with the three combination frames and shadow masks lifted above the top surface of the carrier frame via pins of the alignment stage(s) of the alignment system.

As shown in FIGS. 4 and 5, the first example multi-shadow mask alignment system includes an alignment system 10 positioned on a second (bottom) side of carrier 2 opposite the plural combination of frames and shadow masks 6/8. Alignment system 10 can include one or more alignment stages 12 as deemed suitable and/or desirable for fine positioning each combination frame and shadow mask 6/8 in the manner described hereinafter. In an example, each aperture 4 can include a dedicated alignment stage 12 for fine positioning the combination frame and shadow mask 6/8 positioned with its shadow mask 8 in alignment with said aperture 4. However, this is not to be construed as limiting since it is envisioned that each alignment stage 12 can be configured and operative to fine or precision align of any number combination frames and shadow masks 6/8. In an example, a single alignment stage 12 can be configured and operative for fine or precision aligning two or more combination frames and shadow masks 6/8 in the manner described hereinafter.

For the purpose of description, it will be assumed that there is a one-to-one correspondence between each combination frame and shadow mask 6/8 and a corresponding alignment stage 12. However, this is not to be construed in a limiting sense.

Each alignment stage 12 includes a number of elongated pins 14 that extend through holes 16 in carrier 2. In an example, three holes 16 (shown best in FIG. 1) surround each aperture 4. However, this is not to be construed in a limiting sense. Pins 14 extending through the holes 16 surrounding each aperture 4 contact the side of the frame 6 supporting the shadow mask 8 aligned with said aperture 4 facing carrier 2.

One or more digital (CCD) cameras 18 are positioned to a side of the plural combination frames and shadow masks 6/8 opposite carrier 2. In an example, each digital camera 18 is positioned to view a single combination frame and shadow mask 6/8. However, this is not to be construed in a limiting sense since it is envisioned that each digital camera 18 can be positioned and operative for viewing two, or more, or all of the combination frames and shadow masks 6/8. For the purpose of description, it will be assumed that there is a one-to-one correspondence between each combination frame and shadow mask 6/8 and digital camera 18. However, this is not to be construed in a limiting sense.

The multi-shadow mask alignment system also includes a programmed controller 20 coupled to each alignment stage 12 of alignment system 10 and each digital camera 18. The combination of controller 20 and digital cameras 18 define a control system of each example multi-mask alignment system described herein that includes digital cameras 18. Controller 20 is operative for controlling alignment system 10 and, more particularly, each alignment stage 12, to fine or precision align each combination frame and shadow mask 6/8 based on a position determined for a first set of alignment features 22 (shown best in FIG. 2) of the combination frame and shadow mask 6/8. In an example, frame 6 includes the first set of alignment features 22.

At a suitable time when it is desired to perform fine or precision alignment of a combination frame and shadow mask 6/8, controller 20 causes alignment stage 12 to extend pins 14 from the retracted position shown in FIG. 4 to the extended position shown in FIG. 5 whereupon the combination frame and shadow mask 6/8 is lifted from the first side of carrier 2 in the Z direction thereby defining a gap 24. The digital camera 18 positioned to the side of the combination frame and shadow mask 6/8 opposite carrier 2 acquires and forwards digital images, including the first set of alignment features 22, to controller 20 which is operative for processing the digital images and, based on the processed digital images, to control alignment stage 12 to fine or precision adjust the position of the combination frame and shadow mask 6/8.

More specifically, controller 20 is operative for processing the digital images, including the first set of alignment features 22, and, based on the processed digital images, to control alignment stage 12 to adjust the position of the combination frame and shadow mask 6/8 in the X, Y and/or θ directions such that the first set of alignment features are fine or precision aligned to a predetermined set of coordinates stored in a memory 21 of controller 20. This predetermined set of coordinates can be stored in memory 21 in any suitable or desirable format, including, for example, a drawing or CAD file. However, this is not to be construed in a limiting sense since it is envisioned that any suitable and/or desirable manner of storing the predetermined set of coordinates that controller 20 utilizes to align with the first set of alignment features 22 can be utilized.

In an example, controller 20 is programmed to identify the first set of alignment features 22 and their locations in an image acquired from digital camera 18 of the combination frame and shadow mask 6/8. Upon identifying the first set of alignment features 22 and their locations, controller causes alignment stage 12 to fine or precision align the first set of alignment features 22 to the predetermined coordinates stored in a file in memory 21 of controller 20. The alignment features 22 can be points, lines, contours, circles, rings, and/or any other suitable and/or desirable feature. The alignment of the first set alignment features 22 can be based on intensity of the first set of alignment features 22 or based on image features. In an example, controller can compare the first set of alignment features 22 in an acquired image to a predetermined set of alignment features at a predetermined set of coordinates stored in a digital reference or source image stored in memory 21 of controller 20. Absent alignment between the first set alignment features 22 and the predetermined set of alignment features of the reference or source image stored in memory 21, controller 20 can cause alignment stage 12 to move in the X, Y and/or θ directions as necessary in order to align the predetermined set of alignment features in the reference or source image to the first set of alignment features 22 in an image acquired of the combination frame and shadow mask 6/8 by digital camera 18. The particular manner in which the first set of alignment features 22 is compared to a predetermined set of coordinates stored in memory 21 of controller 20 is not to be construed as limiting since it is envisioned that such comparison can occur in any suitable and/or desirable manner now known or hereinafter developed.

More specifically, in order to perform fine or precision alignment of the first set of alignment features 22 to the predetermined set of coordinates stored in memory 21 after gap 24 is formed, controller 20 causes alignment stage 12 to move the combination frame and shadow mask 6/8, as necessary, in the X, Y and/or θ direction (clockwise or counterclockwise) around the Z direction. Once controller 20 has determined that the first set of alignment features 22 are fine or precision aligned to the predetermined set of coordinates stored in memory 21, controller causes alignment stage 12 to lower pins 14 thereby returning combination frame and shadow mask 6/8 from the position shown in FIG. 5 back to the position shown in FIG. 4, with frame 6 in contact to the first side of carrier 2. Thereafter, each combination frame and shadow mask 6/8 can be secured to carrier 2 in any suitable and/or desirable manner, such as, for example, adhesive or welding frame 6 to carrier 2, to form a finished assembly 25 comprising carrier 2 having a plurality of combination frames and shadow masks 6/8 secured thereto with each shadow mask 8 fine or precision aligned to each other combination frame and shadow mask 6/8 secured to carrier 2. In an example, the first set of alignment features and the predetermined set of alignment features can be complementary. However, this is not to be construed in a limiting sense.

Figure 8:
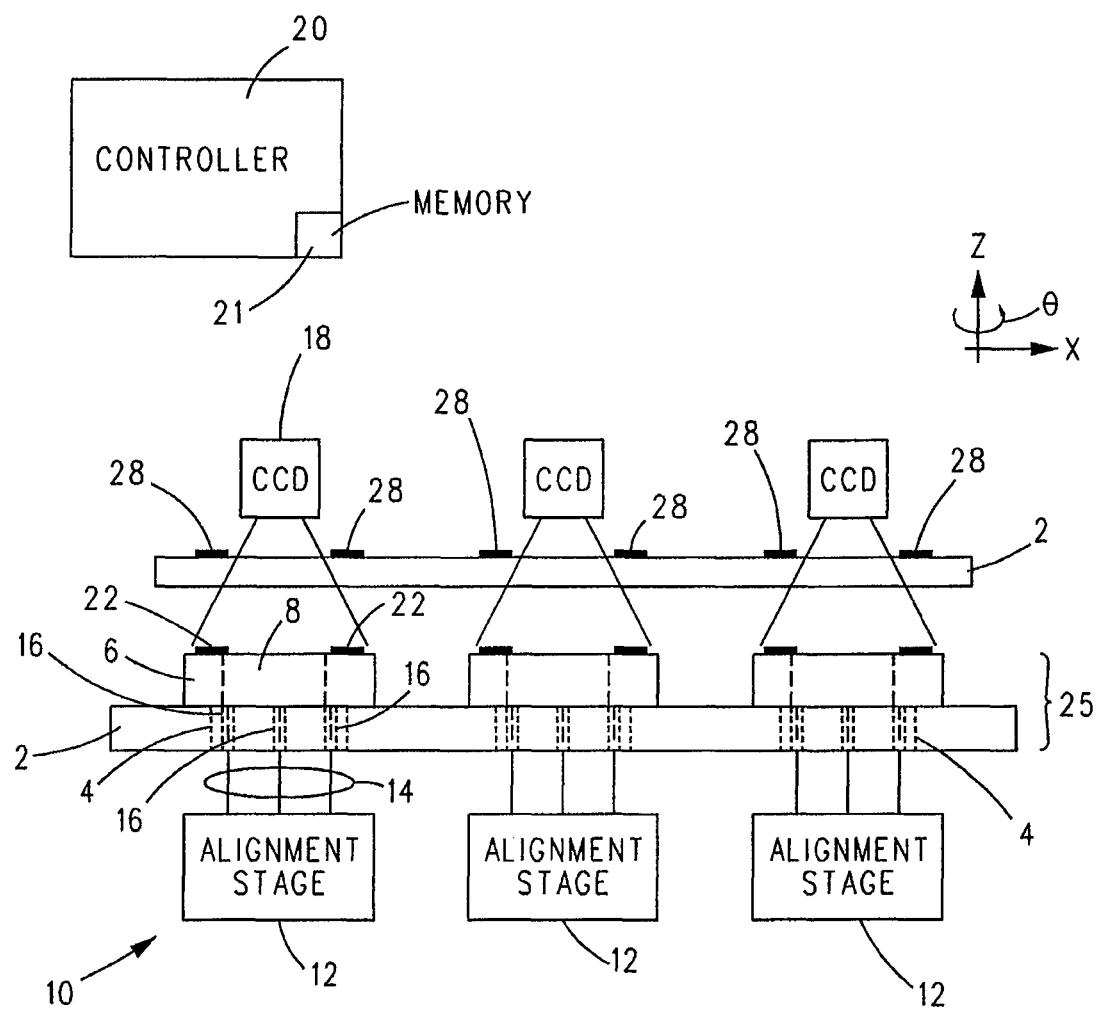
FIG. 8 is a schematic side view of the multi-mask alignment system shown in FIG. 4 including the alignment substrate of FIG. 7 positioned between the three digital cameras and the three combination frames and shadow masks.
Figure 9:
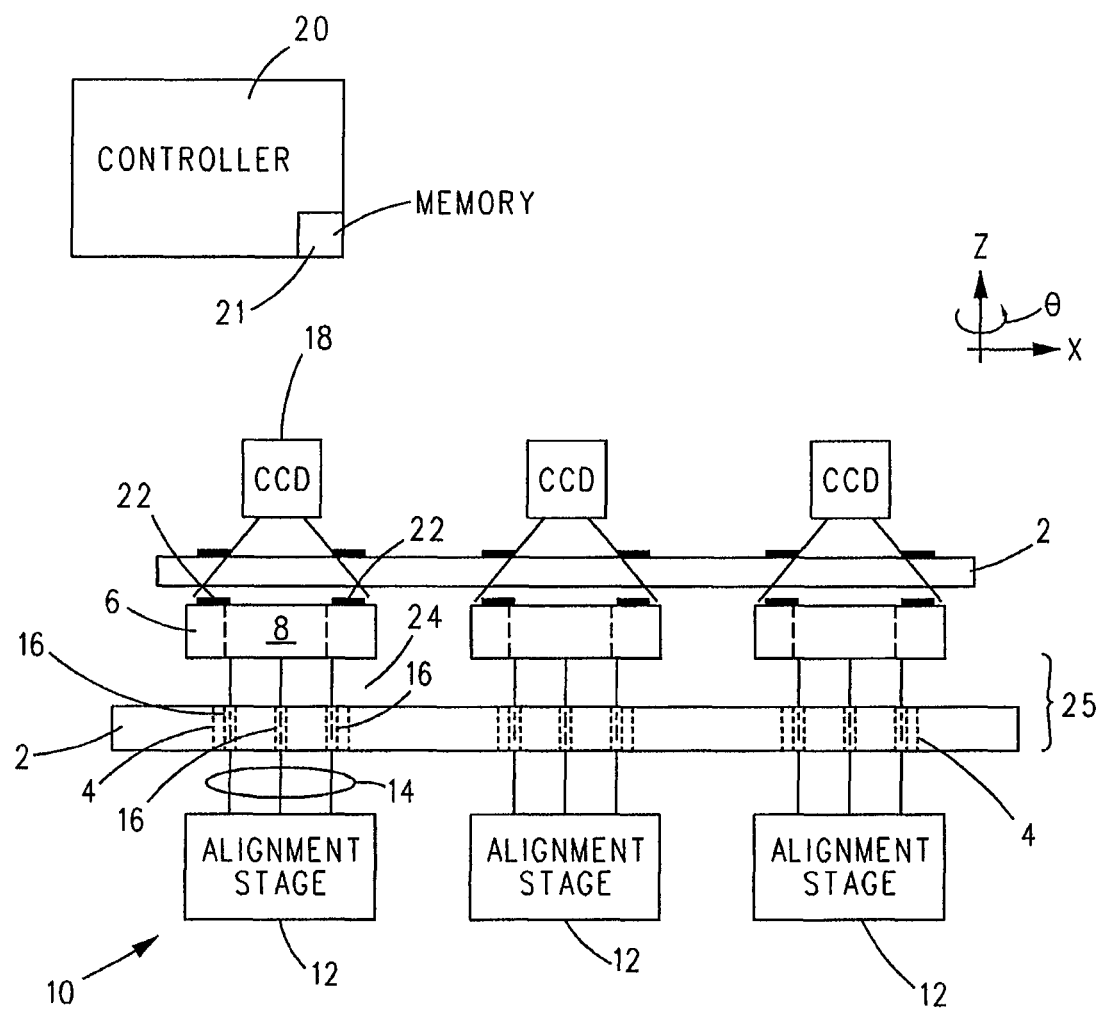
FIG. 9 is a view of the multi-mask alignment system shown in FIG. 8 with the three combination frames and shadow masks lifted above the top surface of the carrier frame via pins of the alignment stage(s) of the alignment system.
Figure 10:
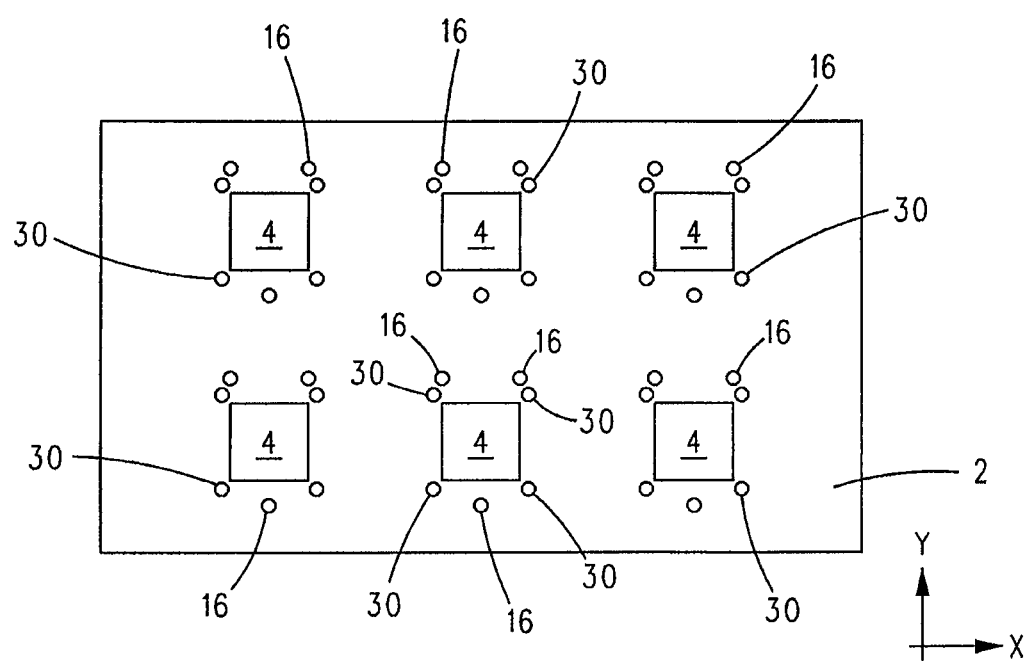
FIG. 10 is a plan view of another example carrier frame including a second set of alignment features (different than the second set of alignment features shown on the alignment substrate in FIG. 7)
Figure 11:
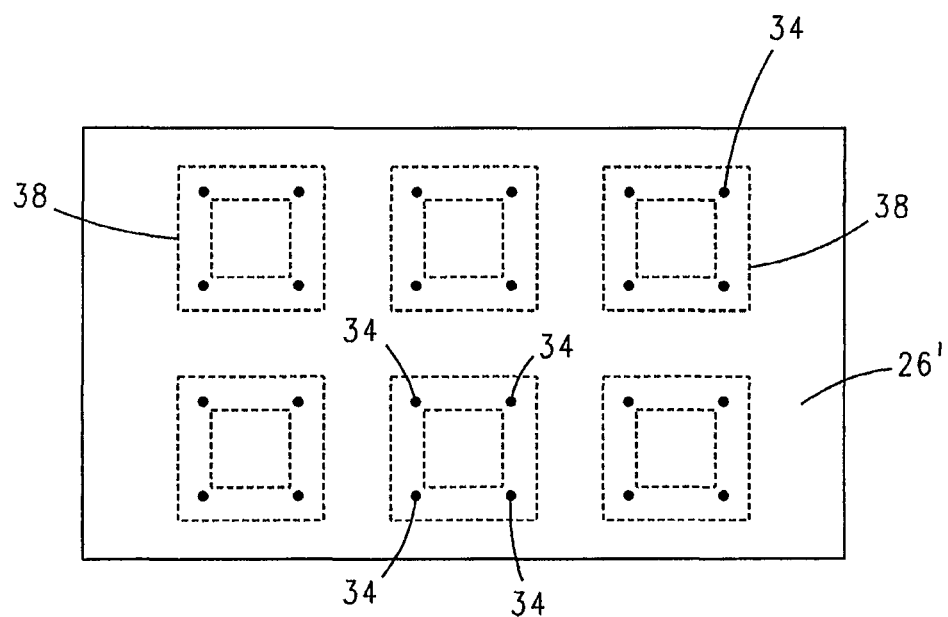
FIG. 11 is a plan view of an alignment substrate including a number of light receivers and optional support frames (shown in phantom) for supporting the light receivers on the alignment substrate.
Figure 12:
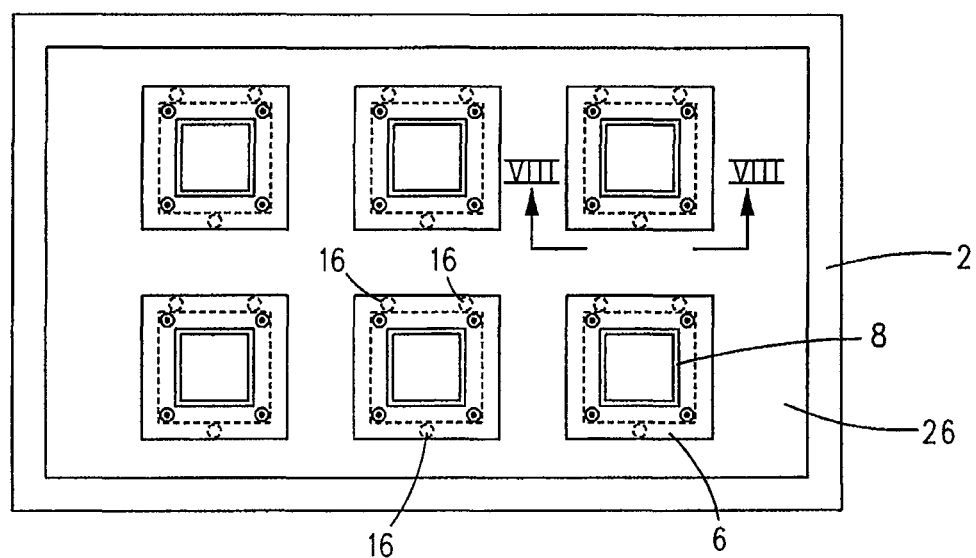
FIG. 12 is a plan view of the alignment substrate of FIG. 11 positioned over a plurality of combination frames and shadow masks disposed on the carrier frame shown in FIG. 10.

With reference to FIGS. 6-9 and with continuing reference to FIGS. 1-5, in a second example multi-mask alignment system, similar in many respects to the first example multi-mask alignment system of FIGS. 1-5, an alignment substrate 26 (FIG. 7) is positioned between digital cameras 18 and the plurality of combination frames and shadow masks 6/8 (FIGS. 8 and 9). In an example, alignment substrate 26 is transparent and is made of a material that has good dimensional stability, such as, for example, glass. Alignment substrate 26 includes a second set of alignment features 28 (shown best in FIG. 7) in a pattern corresponding to the pattern of the first set of alignment features 22 (shown, e.g., in FIG. 6) of the plural combination frames and shadow masks 6/8 positioned in coarse alignment on carrier 2.

In this example, each digital camera 18 is operative for acquiring and forwarding digital images, including the first and second sets of alignment features 22 and 28, to controller 20 which is operative for processing the digital images and, based on the processed digital images, to cause alignment system 10 to adjust the position of each combination frame and shadow mask 6/8 to fine or precision align the first and second set of alignment features 22 and 28.

For the purpose of description, it will be assumed that a single alignment stage 12 of alignment system 10 and a single digital camera 18 are utilized for fine or precision alignment of a single combination frame and shadow mask 6/8. However, this is not to be construed in a limiting sense.

At a suitable time, controller 20 causes alignment stage 12 to extend pins 14 from the retracted position shown in FIG. 8 to the extended position shown in FIG. 9 defining gap 24 between the first side of carrier 2 and the side of the combination frame and shadow mask 6/8 facing carrier 2.

Digital camera 18 positioned to the side of the combination frame and shadow mask 6/8 opposite carrier 2 acquires and forwards digital images, including the first and second sets of alignment features 22 and 28, to controller 20. Controller 20 is operative for processing the digital images and, based on the processed digital images, to cause alignment stage 12 to move in the X, Y and/or θ directions as necessary in order to fine or precision align the first and second sets of alignment features 22 and 28.

In this example, each frame 6 includes four alignment features 22 (FIG. 6) and alignment substrate 26 includes four alignment features 28 (FIG. 6) configured to be aligned with the four alignment features 22 of said frame 6. The number of first and second sets of alignment features 22 and 28 used for aligning each combination frame and shadow mask 6/8 is not to be construed in a limiting sense.

Figure 6:
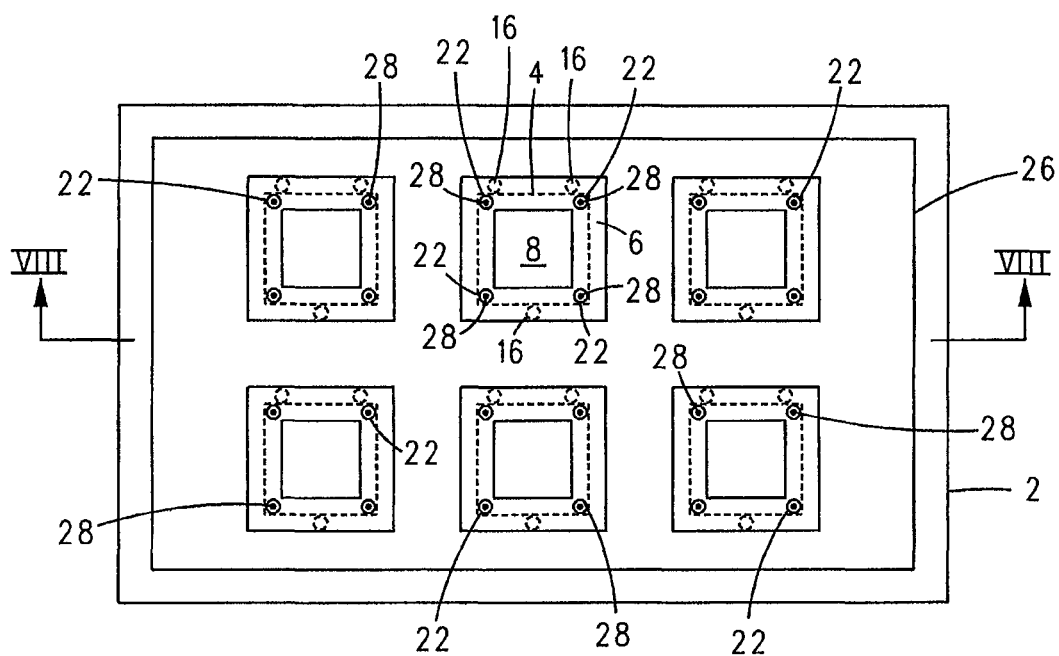
FIG. 6 is a schematic plan view of an alignment substrate positioned over the plural combination frames and shadow masks positioned on a carrier frame shown in FIG. 2.
Figure 7:
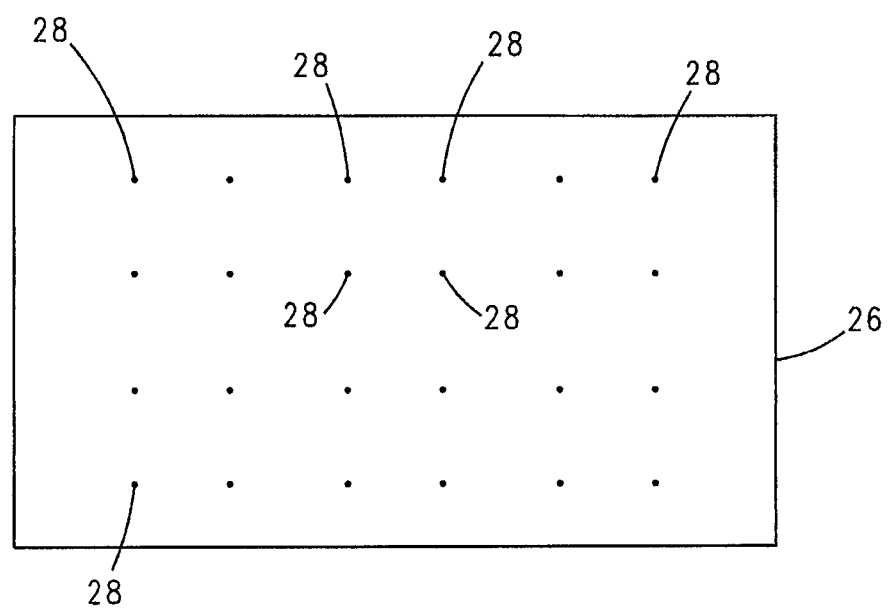
FIG. 7 is an isolated schematic plan view of the alignment substrate of FIG. 6 including a second set of alignment features.

In an example, the alignment features on frame 6 can be complementary with the corresponding alignment features 28 of alignment substrate 26. For example, each alignment feature 22 can be one of a ring (as shown in FIG. 6) or a filled-in circle and each alignment feature 28 can be the other of a filled-in circle (also as shown in FIG. 6) or a ring. Different styles or shapes of alignment features 22 and 28, complementary or not, are envisioned.

Once controller 20 has determined that the first and second sets of alignment features 22 and 28 are aligned, controller causes alignment stage 12 to lower pins 14 thereby returning the combination frame and shadow mask 6/8 from the position shown in FIG. 9 back to the position shown in FIG. 8 with the frame 6 in contact with the first side of carrier 2. Thereafter, each combination frame and shadow mask 6/8 is secured to carrier 2 in any suitable and/or desirable manner, such as, for example, by adhesive or welding, to form finished assembly 25.

With reference to FIGS. 10-14 and with continuing reference to all previous figures, in a third example multi-mask alignment system, alignment substrate 26 includes light receivers 34 (in place of the second set of alignment features 28 on the alignment substrate 26 of the second example multi-mask alignment system) and carrier 2 is provided with a second set of alignment features 30. It is to be appreciated that alignment features 28 of alignment substrate 26 (in the second example multi-mask alignment system) and alignment features 30 of carrier 2 (in this third example multi-mask alignment system) are each used independently with the first set of alignment features 22 of the combination frame and shadow mask 6/8. Optional support frames 38 (shown in phantom) can be included on carrier 2 for supporting light receivers 34 to avoid sagging of carrier 2 due to the added weight of light receivers 34.

In an example, either one or both of the first and second sets of alignment features 22 and 30 can be holes. If desired, the holes of the first and/or second sets of alignment features 22 and 30 can be filled with a light transmissive material.

Light sources 32 (FIGS. 13 and 14) can be positioned on the second (bottom) side of carrier 2 opposite the combination frame and shadow mask 6/8. In an example, each light receiver 34 (e.g., a photodiode) disposed on alignment substrate 26 is configured to be aligned with the light output from one of the light sources 32 (e.g., an LED) thereby defining a light source-light receiver pair 32/34. Each light source-light receiver pair 32/34 defines therebetween a light path 36. In an example, one alignment feature 22 of the first set of alignment features 22 and one alignment feature 30 of the second set of alignment features 30 are positioned along each light path 36.

In this example, controller 20 is operative for processing the outputs of light receivers 34 and, based on the processed outputs of light receivers 34, for causing the alignment stage 12 to adjust a position of the combination frame and shadow mask 6/8 to fine or precision align the one alignment feature 22 of the first set of alignment features and the one alignment feature 30 of the second set of alignment features in each light path 36. In this example, controller 20 and light receivers 34 define a control system.

For the purpose of this description, it will be assumed that a single alignment stage 12 of alignment system 10 and a plurality of light source-light receiver pairs 32/34 defining light pairs 36 are utilized for fine or precision alignment of a single combination frame and shadow mask 6/8. In a particular example, four light source-light receiver pairs 32/34 defining four light paths 36 are utilized for fine or precision alignment of a single combination frame and shadow mask 6/8. However, this is not to be construed in a limiting sense.

Figure 13:
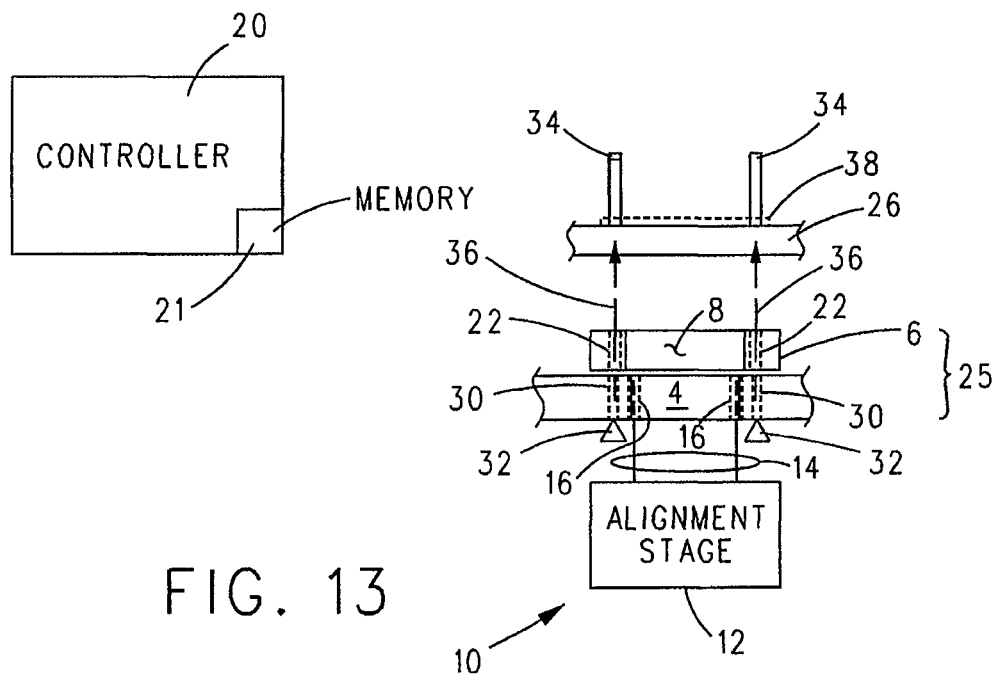
FIG. 13 is a view taken along lines XIII-XIII in FIG. 12 of the alignment substrate including light receivers positioned over a combination frame and shadow mask disposed on a top surface of the carrier frame shown in FIG. 10 and light sources positioned under the carrier frame.
Figure 14:
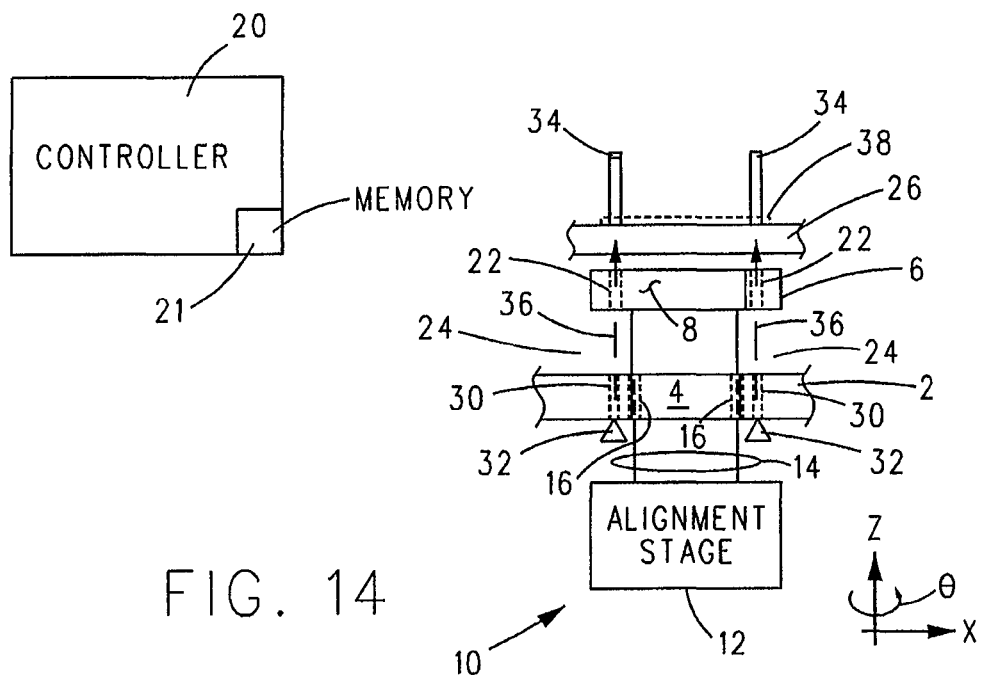
FIG. 14 is a view of the multi-mask alignment system shown in FIG. 13 with the combination frame and shadow mask lifted above the top surface of the carrier frame via the pins of alignment stage of the alignment system.

At a suitable time, controller 20 causes alignment stage 12 to extend pins 14 from the retracted position shown in FIG. 13 to the extended position shown in FIG. 14 thereby forming gap 24. Then, with light sources 32 on, controller causes alignment stage 12 to move the combination frame and shadow mask 6/8 in the X, Y and/or θ directions as necessary to fine or precision align the first set of alignment features 22 to the corresponding second set of alignment features 30 (wherein one alignment feature 22 of the first set of alignment features and one alignment feature 30 of the second set of alignment features lie along each light path 36 as shown) until a predetermining amount of light is received by the light receivers 34 used for aligning said combination frame and shadow mask 6/8.

Once controller 20 has determined, via the outputs of light receivers 34, that the fine or precision alignment of the combination frame and shadow mask 6/8 is complete, controller 20 causes alignment stage 12 to return the combination frame and shadow mask 6/8 from the position shown in FIG. 14 back to the position shown in FIG. 13, with frame 6 in contact with the first side of carrier 2. Thereafter, each combination frame and shadow mask 6/8 is secured to carrier 2 in any suitable or desirable manner, such as, for example, adhesive or welding frame 6 to carrier 2, to form finished assembly 25.

With reference to FIGS. 15-18C, in a fourth example multi-mask alignment system, alignment system 10 includes a single, movable alignment stage 12 positioned on the second (bottom) side of carrier 2 opposite the plural combination of frames and shadow masks 6/8. In this example, single alignment stage 12 is configured to translate, move, or visit each combination frame and shadow mask 6/8, one-at-a-time, whereupon single alignment stage 12 can align the combination frame and shadow mask 6/8 positioned above single alignment stage 12 in the manner described above. For example, following single alignment stage 12 at a first position 100 (FIG. 17) aligning a first combination frame and shadow mask 6/8 positioned above single alignment stage 12, single alignment stage 12 can translate or move to a second position 102. Following movement to second position 102, single alignment stage 12 can align a second combination frame and shadow mask 6/8 positioned above single alignment stage 12 at second position 102. Thereafter, single alignment stage 12 can translate or move to a third position 104 whereupon single alignment stage 12 can aligning a third combination frame and shadow mask 6/8 positioned above single alignment stage 12 at third position.

Where carrier 2 supports multiple rows and multiple columns of combination frames and shadow masks 6/8, single alignment stage 12 can be configured to translate or move on the second (bottom) side of carrier 2 to a position below each combination frame and shadow mask 6/8, one-at-a time. Accordingly, the illustration in FIG. 17 of single alignment stage 12 translating in a single direction, from left to right, is not to be construed in a limiting sense.

In the fourth example multi-mask alignment system, one or more digital cameras 18 can be positioned on and move with single alignment stage 12. In an example, each digital camera 18 faces upwards and can acquire one or more digital images of the shadow mask 8 positioned above the digital camera 18 on single alignment stage 12. For the purpose of description only, single alignment stage 12 will be described as having a single digital camera 18. However, this is not to be construed in a limiting sense since it is envisioned that single alignment stage 12 can have multiple digital cameras 18 as needed.

Single alignment stage 12 can include a number of elongated pins 14 that can be extended between a position below carrier 2, through holes 16 in carrier 2, into contact the side of the frame 6 supporting the shadow mask 8 positioned above single alignment stage 12, and then back to the position below carrier 2.

Programmed controller 20 can be coupled to single alignment stage 12 and coupled to digital camera 18 mounted on single alignment stage 12. In an example, the combination of controller 20, moveable single alignment stage 12, and digital camera 18 can define a control system. Controller 20 can be operative for controlling single alignment stage 12 to translate or move to positions below each combination frame and shadow mask 6/8, one-at-a-time, and, thereafter, to fine or precision align the combination frame and shadow mask 6/8 above single alignment stage 12 based on a position determined for a first set of alignment features 22 (see e.g., FIG. 17) of the combination frame and shadow mask 6/8.

In an example, each shadow mask 8 can include the first set of alignment features 22. However, this is not to be construed in a limiting sense since it is envisioned that frame 6 supporting the shadow mask 8 can also or alternatively include one or more of the alignment features 22. In an example, each alignment features 22 can be a visual mark on a side of frame 6 and/or shadow mask 8 that will face digital camera 18 or a hole through frame 6 and/or shadow mask 8. Alignment features 22 can also include combinations of visual marks and holes.

In an example, one or more optional light sources 32 can be positioned on the first (top) side of carrier 2. The illustration in FIGS. 17-18C of multiple light sources 32 is not to be construed in a limiting sense since the use of a single light source 32 is envisioned. Light source(s) 32 can be configured to output light, for example, collimated light, that can highlight alignment features 22 in the nature of visual marks (where frame 6 and/or shadow mask 8 is/are at least partially transparent) or pass through alignment features 22 in the nature of holes through frame 6 and/or shadow mask 8 for acquisition by digital camera 18.

Figure 15:
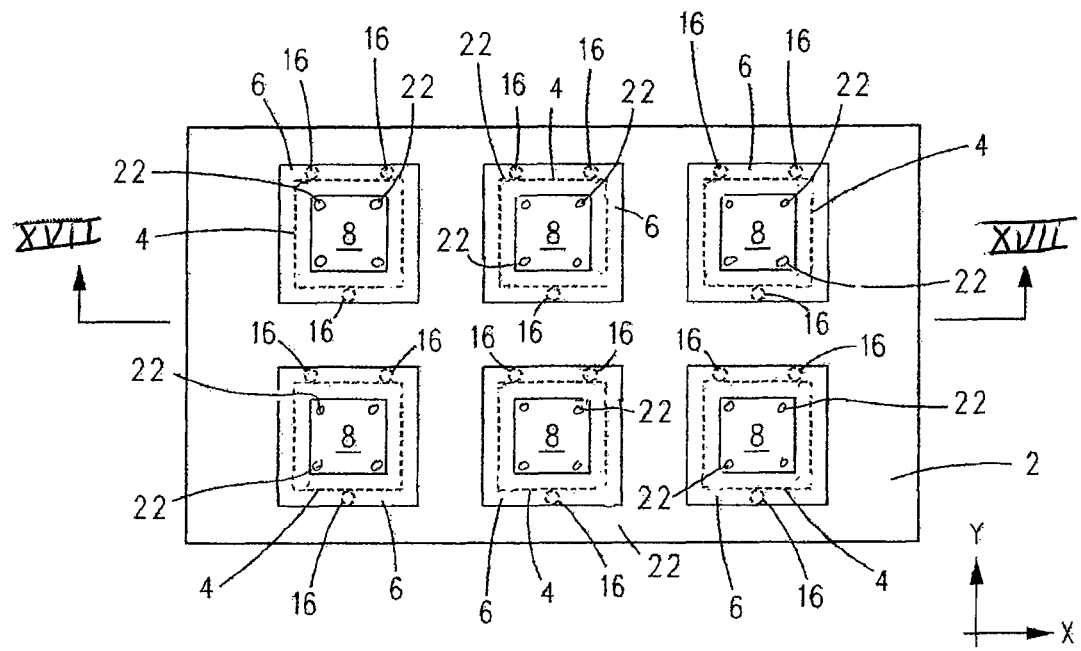
FIG. 15 is a schematic plan view of plural combination frames and shadow masks positioned on the carrier frame of FIG. 1, with each shadow mask positioned in alignment with an aperture in the carrier frame.
Figure 16:
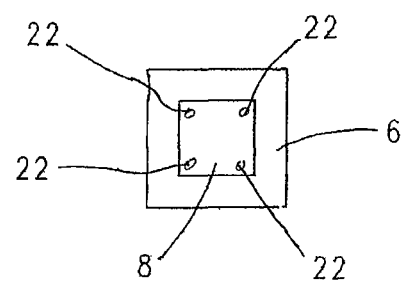
FIG. 16 is an isolated schematic plan view of a combination frame and shadow mask shown in FIG. 15 including a first set of alignment features on the shadow mask.
Figure 17:
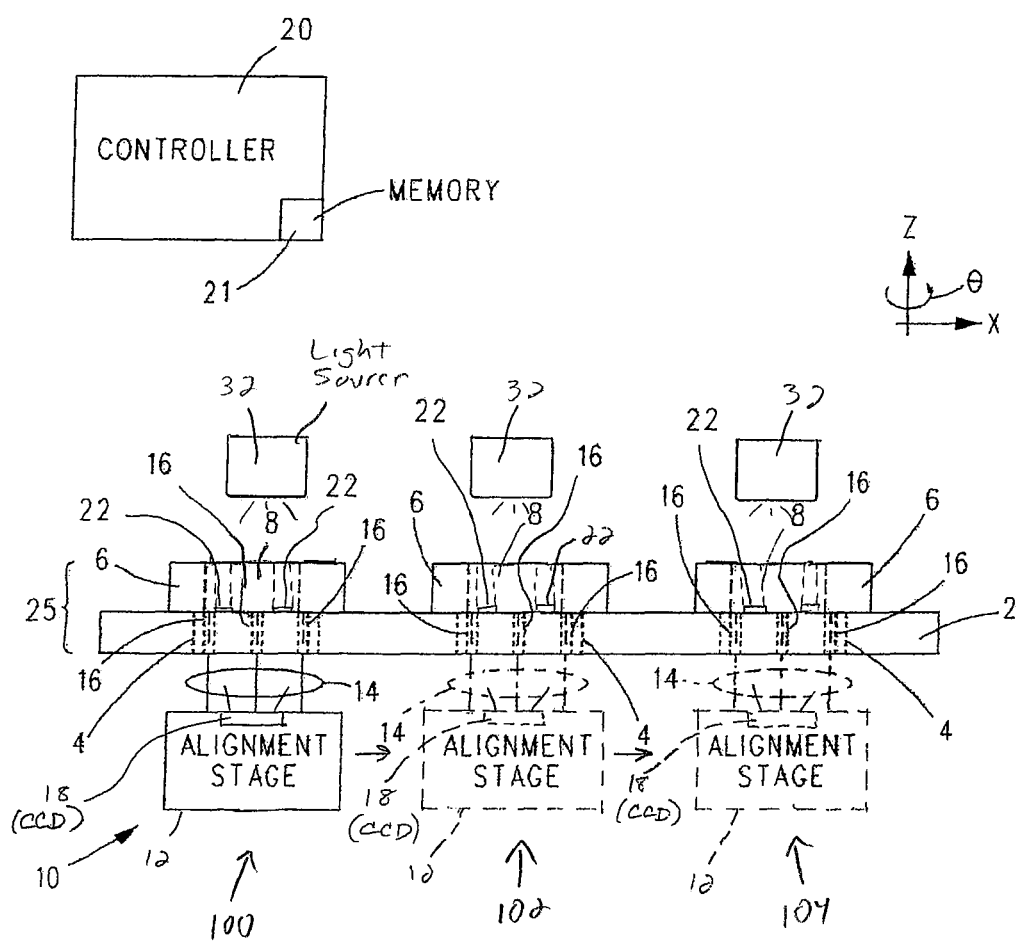
FIG. 17 is a schematic side view taken along lines XVII-XVII in FIG. 15 of the carrier frame including three combination frames and shadow masks in contact with the carrier frame, and further including a schematic of an alignment system including a single alignment stage positioned below the carrier frame, wherein the alignment stage is translatable, one-at-a-time, to a position below each combination frame and shadow mask, wherein the alignment stage includes one or more digital (CCD) cameras positioned to view the first set of alignment features of each shadow mask from below the carrier frame.
Figure 18A:
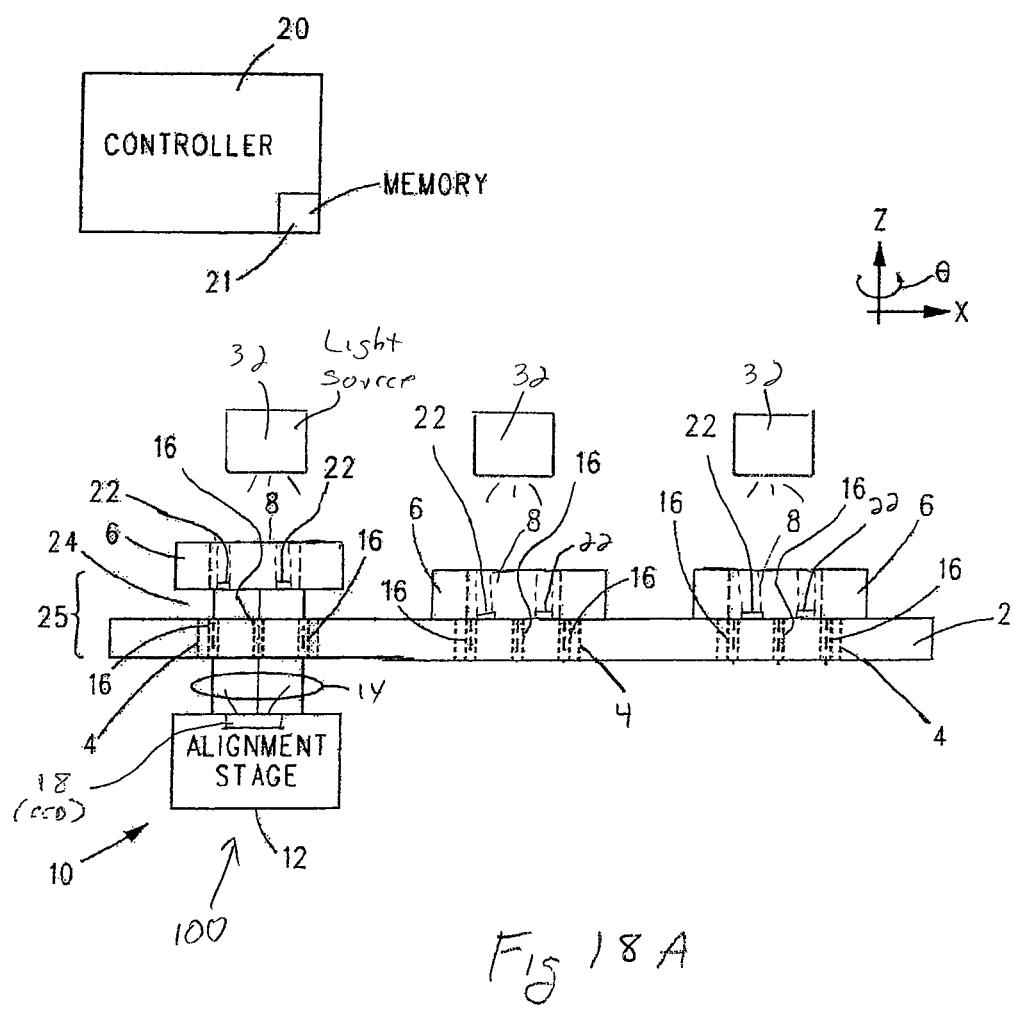
FIGS. 18A-18C are views of the multi-mask alignment system shown in FIG. 17 showing the alignment stage lifting each combination frame and shadow mask, one-at-a-time, above the top surface of the carrier frame via pins of the alignment stage and translating between combination frames and shadow masks between lifting of each combination frame and shadow mask.
Figure 18B:
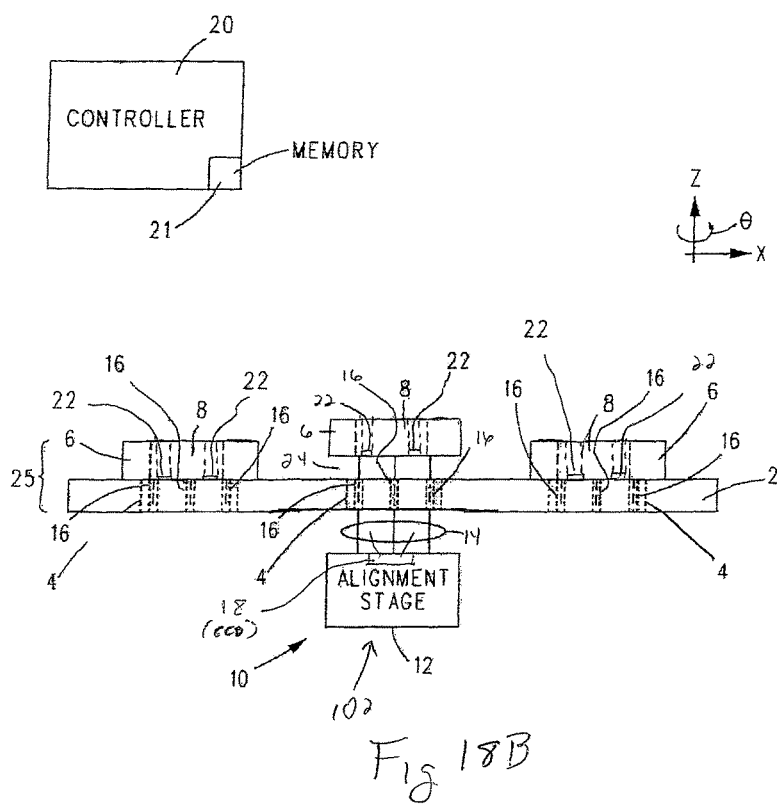
Figure 18C:
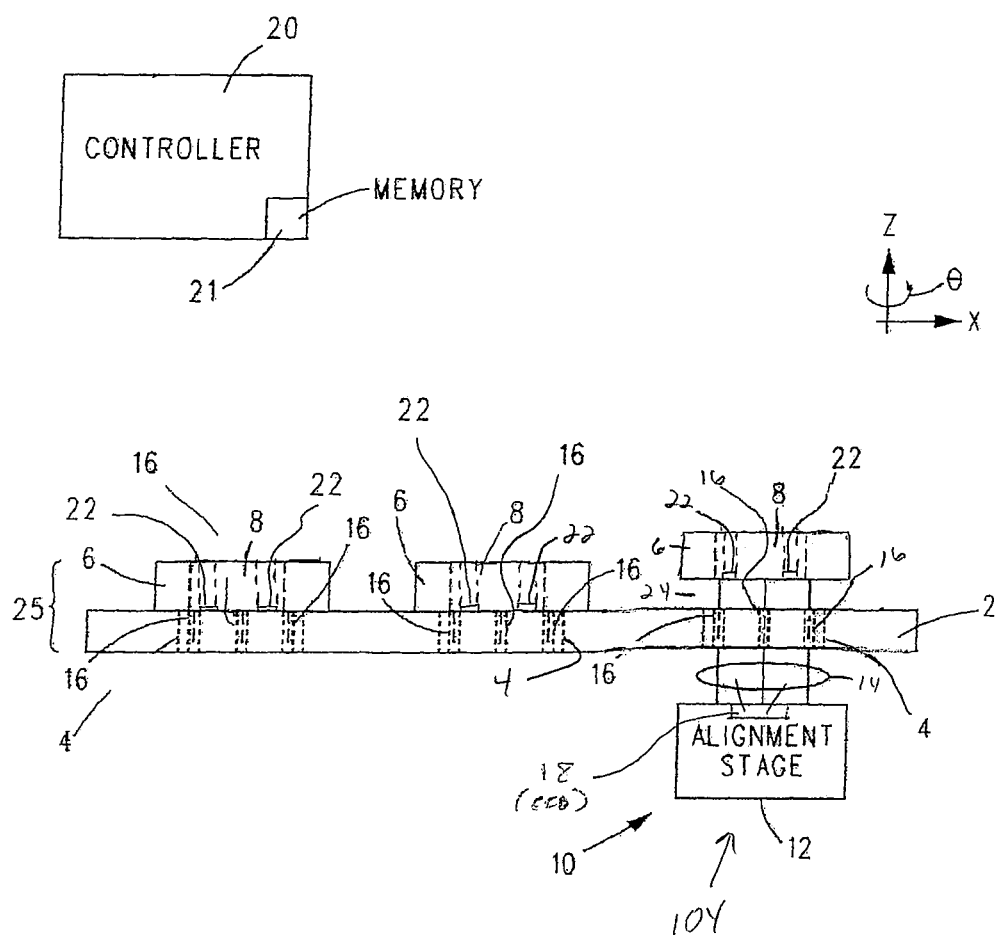

With reference to FIGS. 18A-18C and with continuing reference to FIGS. 15-17, starting with single alignment stage 12 at the first position 100, when it is desired to perform fine or precision alignment of the combination frame and shadow mask 6/8 positioned on the first side of carrier 2 above first position 100, controller 20 causes single alignment stage 12 to extend pins 14 from the retracted position shown in FIG. 17 to the extended position shown in FIG. 18A whereupon the combination frame and shadow mask 6/8 is lifted from the first side of carrier 2 in the Z direction thereby defining gap 24. Digital camera 18 positioned on single alignment stage 12 on the second side of carrier 2 acquires and forwards digital images, including the first set of alignment features 22, to controller 20 which is operative for processing the digital images and, based on the processed digital images, to control alignment stage 12 to fine or precision adjust the position of the combination frame and shadow mask 6/8.

More specifically, and as described above, controller 20 can be operative for processing the digital images, including the first set of alignment features 22, and, based on the processed digital images, to control single alignment stage 12 to adjust the position of the combination frame and shadow mask 6/8 in the X, Y and/or θ directions such that the first set of alignment features are fine or precision aligned to a predetermined set of coordinates stored in memory 21 of controller 20.

In an example, controller 20 can be programmed or configured to identify the first set of alignment features 22 and their locations in an image acquired from digital camera 18 of the combination frame and shadow mask 6/8. Upon identifying the first set of alignment features 22 and their locations, controller can cause single alignment stage 12 to fine or precision align the first set of alignment features 22 to the predetermined coordinates stored in a file in memory 21 of controller 20. Alignment features 22 can be holes or visual marks, such as, for example, points, lines, contours, circles, rings, and/or any other suitable and/or desirable feature.

The alignment of the first set alignment features 22 can be based on intensity light passing through one or more holes comprising the first set of alignment features 22 and/or based on one or more visual image features comprising the first set of alignment features 22. In an example, controller 20 can compare the first set of alignment features 22 in an acquired image to a predetermined set of alignment features at a predetermined set of coordinates stored in a digital reference or source image stored in memory 21 of controller 20. Absent alignment between the first set alignment features 22 and the predetermined set of alignment features of the reference or source image stored in memory 21, controller 20 can cause single alignment stage 12 to move in the X, Y and/or θ directions as necessary in order to align the predetermined set of alignment features in the reference or source image to the first set of alignment features 22 in an image acquired of the combination frame and shadow mask 6/8 by digital camera 18. The particular manner in which the first set of alignment features 22 is compared to a predetermined set of coordinates stored in memory 21 of controller 20 is not to be construed as limiting since it is envisioned that such comparison can occur in any suitable and/or desirable manner now known or hereinafter developed.

More specifically, in order to perform fine or precision alignment of the first set of alignment features 22 to the predetermined set of coordinates stored in memory 21 after gap 24 is formed, controller 20 causes single alignment stage 12 to move the combination frame and shadow mask 6/8, as necessary, in the X, Y and/or θ direction (clockwise or counterclockwise) around the Z direction. Once controller 20 has determined that the first set of alignment features 22 are fine or precision aligned to the predetermined set of coordinates stored in memory 21, controller causes single alignment stage 12 to lower pins 14 thereby returning the combination frame and shadow mask 6/8 from the position shown in FIG. 18A back to the position shown in FIG. 17, with frame 6 in contact to the first side of carrier 2.

In an example, controller 20 can then cause single alignment stage 12 to translate or move from the first position 100 (FIG. 18A) to the second position 102 (FIG. 18B) whereupon controller 20 can cause single alignment stage 12 to, in the manner described above, lift the combination frame and shadow mask 6/8 positioned above second position 102 from the first side of carrier 2 in the Z direction thereby defining gap 24; adjust the position of the combination frame and shadow mask 6/8 in the X, Y and/or θ directions such that the first set of alignment features thereof acquired by digital camera 18 are fine or precision aligned to a (or the) predetermined set of coordinates stored in memory 21 of controller 20; and, thereafter, return the combination frame and shadow mask 6/8 from the position shown in FIG. 18B back to the position shown in FIG. 17, with frame 6 in contact to the first side of carrier 2.

In an example, controller 20 can then cause single alignment stage 12 to translate or move from the second position 102 (FIG. 18C) to the third position 104 (FIG. 18C) whereupon controller 20 can cause single alignment stage 12 to, in the manner described above, lift the combination frame and shadow mask 6/8 positioned above third position 104 from the first side of carrier 2 in the Z direction thereby defining gap 24; adjust the position of the combination frame and shadow mask 6/8 in the X, Y and/or θ directions such that the first set of alignment features thereof acquired by digital camera 18 are fine or precision aligned to a (or the) predetermined set of coordinates stored in memory 21 of controller 20; and, thereafter, return the combination frame and shadow mask 6/8 from the position shown in FIG. 18B back to the position shown in FIG. 17, with frame 6 in contact to the first side of carrier 2.

As can be understood from the forging, the process of translating single alignment stage 12 from one position (e.g., 100 or 102) to another position (e.g., 102 or 104); lifting the combination frame and shadow mask 6/8 positioned above the single alignment stage 12 at this other position; adjusting the position of the combination frame and shadow mask 6/8 in the X, Y and/or θ directions to align the first set of alignment features thereof acquired by digital camera 18 to a (or the) predetermined set of coordinates stored in memory 21 of controller 20; and, thereafter, returning the combination frame and shadow mask 6/8 from the lifted position back to the position in contact to the first side of carrier 2 can be repeated as many times as may be deemed suitable and/or desirable to align any number of combination frames and shadow masks 6/8 positioned on the first (top) side of carrier 2 with respect to each other or with respect to carrier 2.

After returning each combination frame and shadow mask 6/8 from its lifted position back to the position in contact to the first side of carrier 2, controller 20 can optionally compare the positions of the first set of alignment features thereof to a (or the) predetermined set of coordinates stored in memory 21 to determine if alignment was successful. If alignment was not successful, the process of lifting the combination frame and shadow mask 6/8; adjusting the position of the combination frame and shadow mask 6/8 in the X, Y and/or θ directions to align the first set of alignment features thereof acquired by digital camera 18 to a (or the) predetermined set of coordinates stored in memory 21 of controller 20; and returning the combination frame and shadow mask 6/8 from the lifted position back to the position in contact to the first side of carrier 2 can be repeated additional time(s) until controller 20 determines that alignment was successful.

At a suitable time, each combination frame and shadow mask 6/8 can be secured to carrier 2 in any suitable and/or desirable manner, such as, for example, adhesive or welding frame 6 to carrier 2, to form a finished assembly 25 comprising carrier 2 having a plurality of combination frames and shadow masks 6/8 secured thereto with each shadow mask 8 fine or precision aligned to each other combination frame and shadow mask 6/8 secured to carrier 2. In an example, the first set of alignment features and the predetermined set of alignment features can be complementary. However, this is not to be construed in a limiting sense.

Figure 19:
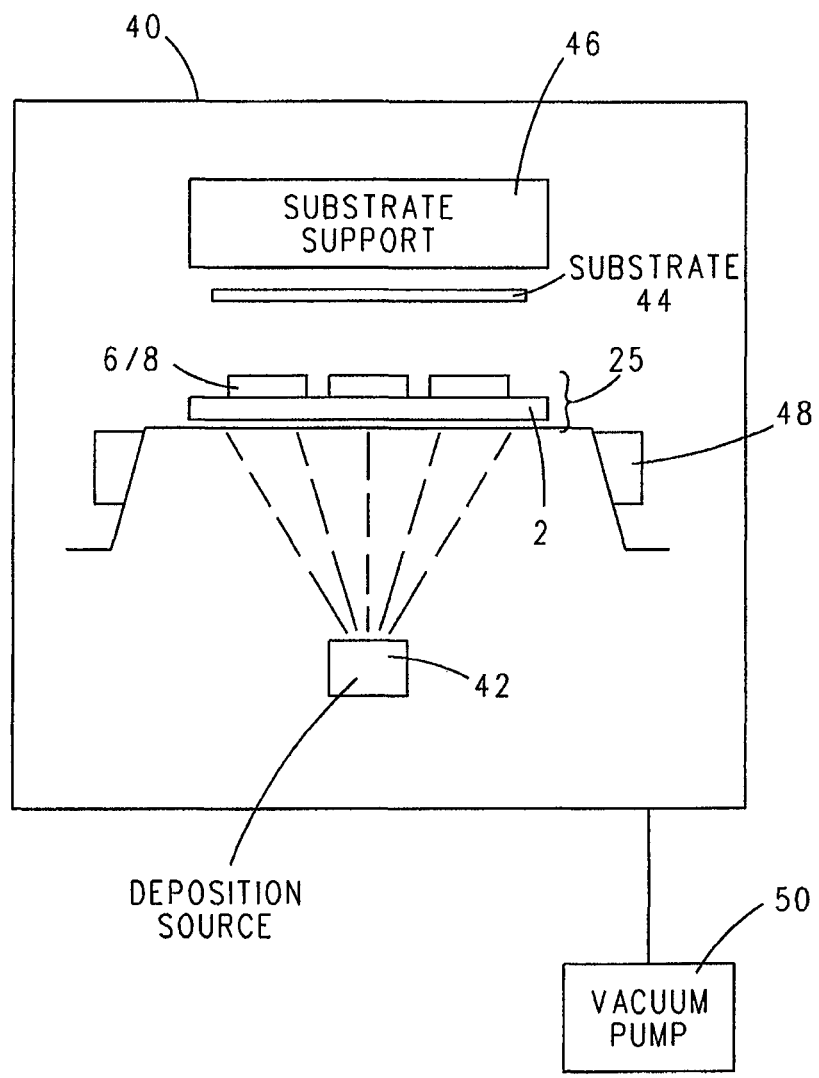
FIG. 19 is a schematic view of a shadow mask vapor deposition chamber including a finished assembly that includes plural combination frames and shadow masks fine or precision aligned on the carrier frame in one of the manners disclosed herein.

With reference to FIG. 19, once finished assembly 25 has been prepared in any of the manners described in the foregoing examples, finished assembly 25 can be placed inside of a deposition vacuum vessel 40 between a deposition source 42 and a substrate 44 which is supported by a substrate support 46. Deposition vacuum vessel 40 can also include an alignment system 48 which can be utilized to align finished assembly 25 and, hence, the shadow masks 8 thereof, to substrate 44. A vacuum pump 50 can be used to evacuate deposition vacuum vessel 40 to a suitable pressure for performing a vapor deposition event therein.

Deposition source 42 is charged with a desired material to be deposited onto substrate 44 via the one or more openings in each shadow mask 8 which is held in intimate contact with a portion of substrate 44 during a deposition event. The one or more openings of each shadow mask 8 correspond to a desired pattern of material to be deposited on substrate 44 from deposition source 42.

The illustration and discussion of finished assembly 25 inside of deposition vacuum vessel 40 is for the purpose showing but one example of the use of finished assembly 25 to perform vapor deposition events through the shadow masks 8 thereof. However, this is not to be construed in a limiting sense.

The embodiments have been described with reference to various examples. Modifications and alterations will occur others upon reading and understanding the foregoing examples. Accordingly, the foregoing examples are not to be construed as limiting the disclosure.

The invention claimed is:

1. A multi-mask alignment method, comprising:
   (a) providing a carrier having a plurality of apertures therethrough;
   (b) providing plural shadow mask-frame combinations on a first side of the carrier, wherein each shadow mask-frame combination includes a first set of alignment features, each shadow mask-frame combination positioned on the first side of the carrier with the frame supporting the shadow mask in alignment with one of the apertures;

(c) providing an alignment system at a first position on a second side of the carrier opposite the first side;

(d) providing a control system including a programmed controller;

(e) under the control of the controller, causing the alignment system at the first position to adjust the X, Y and/or $\theta$ position of one of the plural shadow mask-frame combinations from the second side of the carrier based on positions of the first set of alignment features of said one of the plural shadow mask-frame combinations determined by the controller;

(f) following step (e), under the control of the controller, causing the alignment system to translate to another position on the second side of the carrier; and (g) following step (f), under the control of the controller, causing the alignment system to adjust the X, Y and/or $\theta$ position of another one of the plural shadow mask-frame combinations from the second side of the carrier based on positions of the first set of alignment features of said other one of the plural shadow mask-frame combinations determined by the controller.

2. The method of claim 1, further including repeating steps (f) and (h).

3. The method of claim 1, further including:

(h) securing each shadow mask-frame combination to the carrier.

4. The method of claim 1, further including:

(i) following step (g), performing vapor deposition through each shadow mask.

5. The method of claim 1, wherein the control system includes a digital camera positioned on the alignment system and steps (e) and (g) include causing the alignment system to adjust the position of the one and the other shadow mask-frame combinations based on images of the first and second shadow mask-frame combinations acquired from the camera by the controller such that the first set of alignment features of each of the one and the other shadow mask-frame combinations are aligned to one or more sets of coordinates stored in a memory of the controller.

6. The alignment method of claim 1, wherein the positions of the one and the other combination frames and shadow masks are adjusted with respect to each other.

* * * * *